(12) United States Patent
Paul et al.

(10) Patent No.: US 10,777,607 B1
(45) Date of Patent: Sep. 15, 2020

(54) BITCELLS FOR A NON-VOLATILE MEMORY DEVICE

(71) Applicant: GLOBALFOUNDRIES Inc., Grand Cayman (KY)

(72) Inventors: Bipul C. Paul, Mechanicville, NY (US); Anuj Gupta, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/389,331

(22) Filed: Apr. 19, 2019

(51) Int. Cl.
| | | |
|---|---|---|
| *H01L 27/22* | (2006.01) | |
| *H01L 21/768* | (2006.01) | |
| *H01L 27/02* | (2006.01) | |
| *H01L 27/24* | (2006.01) | |
| *H01L 29/78* | (2006.01) | |

(52) U.S. Cl.
CPC ...... *H01L 27/228* (2013.01); *H01L 21/76895* (2013.01); *H01L 27/0207* (2013.01); *H01L 27/2436* (2013.01); *H01L 29/7831* (2013.01)

(58) Field of Classification Search
CPC .............. H01L 27/228; H01L 27/2436; H01L 29/7831
See application file for complete search history.

(56) References Cited

U.S. PATENT DOCUMENTS

| | | | | |
|---|---|---|---|---|
| 7,742,328 B2* | 6/2010 | Chen | ...................... | B82Y 10/00 365/148 |
| 2009/0108349 A1* | 4/2009 | Kim | .................... | H01L 27/0207 257/347 |

OTHER PUBLICATIONS

J. Li, et al., "Variation-tolerant Spin-Torque Transfer (STT) MRAM array for yield enhancement," 2008 IEEE Custom Integrated Circuits Conference, San Jose, CA, 2008, pp. 193-196.
H. K. Ahn, et al., "Evaluation of STT-MRAM L3 cache in 7nm FinFET process," 2018 International Conference on Electronics, Information, and Communication (ICEIC), Honolulu, HI, 2018, pp. 1-4.
Y. Seo et al., "High-Density SOT-MRAM Based on Shared Bitline Structure," in IEEE Transactions on Very Large Scale Integration (VLSI) Systems, vol. 26, No. 8, pp. 1600-1603, Aug. 2018.
Y. Seo, et al., "High Performance and Energy-Efficient On-Chip Cache Using Dual Port (1R/1W) Spin-Orbit Torque MRAM," in IEEE Journal on Emerging and Selected Topics in Circuits and Systems, vol. 6, No. 3, pp. 293-304, Sep. 2016.
J. Li, et al., "Design Paradigm for Robust Spin-Torque Transfer Magnetic RAM (STT MRAM) From Circuit/Architecture Perspective," in IEEE Transactions on Very Large Scale Integration (VLSI) Systems, vol. 18, No. 12, pp. 1710-1723, Dec. 2010.
Y. Kim, et al., "Multilevel Spin-Orbit Torque MRAMs," in IEEE Transactions on Electron Devices, vol. 62, No. 2, pp. 561-568, Feb. 2015.
Bipul C. Paul et al., "Integrated Circuits Having Memory Cells With Shared Bit Lines and Shared Source Lines", filed Jul. 27, 2018 as U.S. Appl. No. 16/047,882.

* cited by examiner

*Primary Examiner* — Allison Bernstein
(74) *Attorney, Agent, or Firm* — Thompson Hine LLP (57) ABSTRACT

Structures for a bitcell of a non-volatile memory and methods of fabricating such structures. A field-effect transistor of the bitcell includes a gate having gate electrodes that are arranged in a four contacted (poly) pitch layout. An interconnect structure is arranged over the field-effect transistor, and a memory element arranged in the interconnect structure. The memory element is connected by the interconnect structure with the field-effect transistor.

20 Claims, 6 Drawing Sheets

FIG. 2D

BITCELLS FOR A NON-VOLATILE MEMORY DEVICE

BACKGROUND

The present invention relates to integrated circuits and semiconductor device fabrication and, more specifically, to structures for a bitcell of a non-volatile memory and methods of fabricating such structures.

A magnetic random access memory (MRAM) device provides an embedded non-volatile memory technology in which the memory elements operate based on principles of magnetoresistance. Because its memory elements are non-volatile, the data stored by the MRAM device is retained when unpowered. The MRAM device includes multiple bitcells that are arranged in an array of rows and columns. Each bitcell in the array includes a magnetoresistive memory element and a field-effect transistor that controls access to the magnetoresistive memory element for reading and writing data. Each field-effect transistor may include a gate with a single gate electrode or a gate that includes two gate electrodes. A word line is connected to the gate of the field-effect transistors in each row of the array. The word line may be used to select the field-effect transistors in a column of bitcells for data read and write operations to the related magnetoresistive memory elements.

The magnetoresistive memory element of each bitcell includes a pinned layer and a free layer, each of which holds a magnetization. The magnetization of the pinned layer is fixed in its magnetic orientation, and the magnetization of the free layer can be switched by, for example, the application of a programming current. In particular, the magnetic orientations of the pinned and free layers may be programmed to have either a parallel state that provides a low electrical resistance across the layers ("0" state) or an antiparallel state that provides a high electrical resistance across the layers ("1" state).

In a bitcell with a one-transistor one-memory element design, each individual field-effect transistor may include a gate having two gate electrodes arranged in a two contacted (poly) pitch (2CPP) layout or a gate with a single gate electrode in a 1.5CPP layout. As the gate pitch is scaled in connection with advanced technology nodes, a dimension of the field-effect transistor for the bitcell shrinks. However, the back-end-of-line metal stack required for the magnetoresistive memory element cannot be commensurately shrunk to match the scaling of the gate pitch. Due to this process limitation, the one-transistor one-memory element design for the bitcell may become non-manufacturable or, at the least, may have a comparatively large rectangular footprint. In addition, the magnetoresistive memory element is arranged with a significant offset from the center of the bitcell in conventional 2CPP or 1.5CPP layouts. In particular, the magnetoresistive memory element is placed proximate to an outer boundary of the bitcell, which may hinder design options for the bitcell.

Improved structures for a bitcell of a non-volatile memory and methods of fabricating such bitcell structures are needed.

SUMMARY

According to an embodiment of the invention, a structure is provided for a bitcell. The structure includes a field-effect transistor having a gate with gate electrodes that are arranged in a four contacted (poly) pitch layout, an interconnect structure arranged over the field-effect transistor, and a memory element arranged in the interconnect structure. The memory element is connected by the interconnect structure with the field-effect transistor.

According to another embodiment of the invention, a method of forming a structure for a bitcell is provided. The method includes forming a field-effect transistor that includes a gate having gate electrodes that are arranged in a four contacted (poly) pitch layout. The method further includes forming an interconnect structure arranged over the field-effect transistor, and forming a memory element arranged in the interconnect structure. The memory element is connected by the interconnect structure with the field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
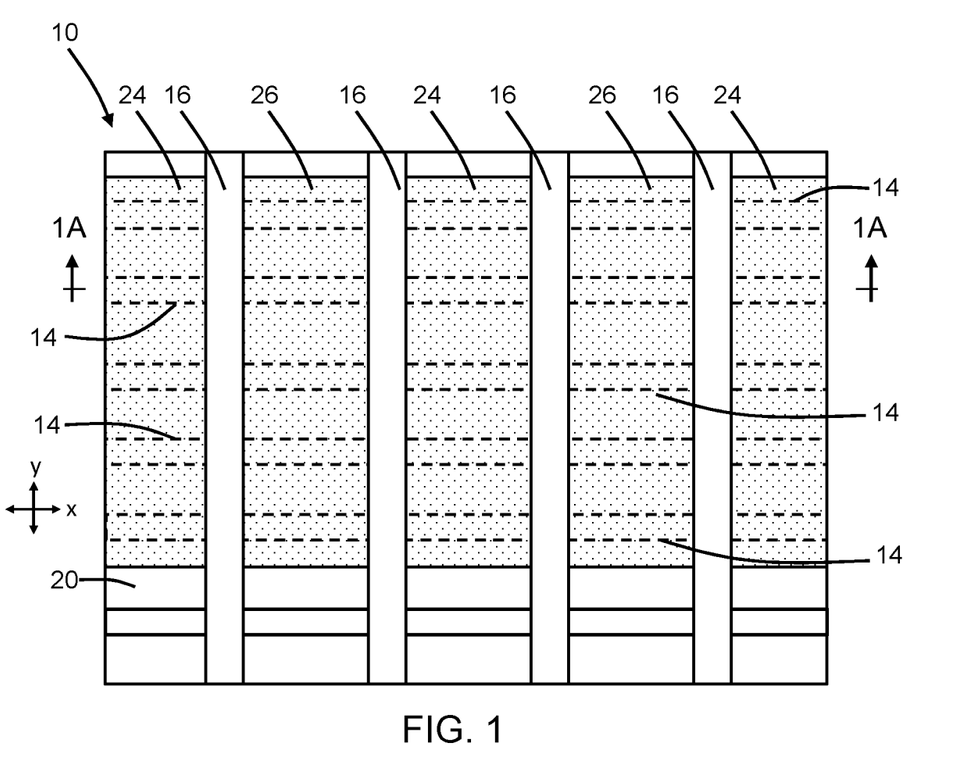
FIG. 1 is a top view of a structure for a bitcell at an initial fabrication stage of a processing method in accordance with embodiments of the invention.
Figure 1A:
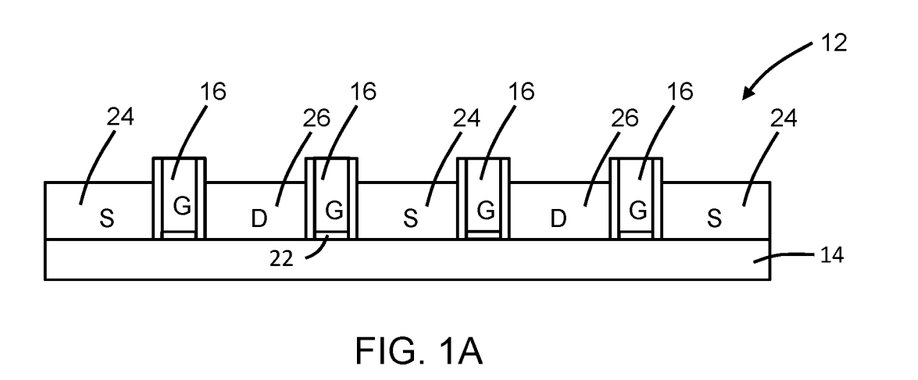
FIG. 1A is a cross-sectional view taken generally along line 1A-1A in FIG. 1.

With reference to FIGS. 1, 1A and in accordance with embodiments of the invention, a bitcell 10 includes a field-effect transistor 12 having semiconductor fins 14 and a gate with gate electrodes 16 that are arranged to overlap with respective channel regions of the semiconductor fins 14. The semiconductor fins 14 and gate electrodes 16 are located on a substrate that is composed of a single-crystal semiconductor material, such as single-crystal silicon. The semiconductor fins 14 may be formed by patterning the substrate or by patterning an epitaxial layer formed on the substrate with lithography and etching processes. Trench isolation 20 may be arranged to surround lower portions of the semiconductor fins 14 and to expose or reveal upper portions of the semiconductor fins 14. The semiconductor fins 14 may be aligned in a given direction (e.g., the x-direction) in a plane with a substantially parallel arrangement. The gate electrodes 16 may be aligned in another given direction (e.g., the y-direction) in the plane with a substantially parallel arrangement such that the gate electrodes 16 are oriented transverse to the semiconductor fins 14. The gate electrodes 16 cross the semiconductor fins 14 to provide an overlapping, wrapped relationship with the respective channel regions.

A gate dielectric layer 22 is formed on the exterior surface of the upper portion of the semiconductor fins 14 in the respective channel regions. The gate dielectric layer 22 is arranged between each gate electrode 16 and the semiconductor fins 14. Each gate electrode 16 may include one or more conformal barrier metal layers and/or work function metal layers, such as metal layers composed of titanium aluminum carbide and/or titanium nitride, and a metal gate fill layer composed of a conductor, such as tungsten. The gate dielectric layer 22 may be composed of a high-k dielectric material, such as hafnium oxide.

The gate electrodes 16 of the gate of the field-effect transistor 12 are patterned to provide a four contacted (poly) pitch (4CPP) layout within the bitcell 10. The gate electrodes 16 may be placed in the 4CPP layout within the bitcell 10 to provide a uniformly-spaced relationship in, for example, the x-direction. The 4CPP layout may provide a design point that balances component placement for the gate electrodes 16 of the field-effect transistor 12 formed by front-end-of-line processes with the placement of connected metal components in an interconnect structure subsequently formed by middle-of-line (MOL) and back-end-of-line (BEOL) processing.

Source regions 24 and drain regions 26 may be formed by epitaxial growth of semiconductor material from the semiconductor fins 14 after the gate electrodes 16 are formed to cover the channel regions. The semiconductor material of the source regions 24 and drain regions 26 may contain a dopant, such as an n-type dopant (e.g., phosphorus and/or arsenic) providing n-type electrical conductivity, and the epitaxially-grown semiconductor material may merge in the spaces between the semiconductor fins 14.

With reference to FIGS. 2, 2A, 2B, 2C, 2D in which like reference numerals refer to like features in FIGS. 1, 1A and following subsequent fabrication stages, a dielectric layer 28 is formed over the gate electrodes 16, source regions 24, and drain regions 26 and planarized to provide a flat top surface. An interconnect structure, generally indicated by reference numeral 30, is subsequently formed over the flat top surface. The interconnect structure 30 includes a contact (CA) level that may be formed by middle-of-line processing, as well as metallization (M0-M4) levels and via (V0-V3) levels that may be formed by back-end-of-line processing. The M0-M4 levels and V0-V3 levels may be formed by damascene processes during back-end-of-line processing. The interconnect structure 30 may include additional metallization and via levels arranged over the M4 level. Conductive features in the different M0-M4 levels function to interconnect the field-effect transistor 12 with a memory element 32 and to provide the connections for lines needed to read data from, and write data to, the bitcell 10.

The CA level includes source contacts 34 that are physically and electrically connected with the source regions 24. The CA level also includes drain contacts 36 that are physically and electrically connected with the drain regions 26. The source contacts 34 and drain contacts 36 may be formed in contact openings defined by lithography and etching in a dielectric layer 38. The source contacts 34 and drain contacts 36 may each include a lower portion containing a metal silicide, such as tungsten silicide, titanium silicide, nickel silicide, or cobalt silicide, formed by silicidation, and an upper portion containing a metal, such as tungsten, that is deposited by chemical vapor deposition and planarized. In an embodiment, the source contacts 34 may be directly connected with the source regions 24, and the drain contacts 36 may be directly connected with the drain regions 26.

The M0 level of the interconnect structure 30 is formed in a dielectric layer 40 that is arranged over the CA level. The M0 level includes a select line (SL) 42 and a metal island 44 that is laterally spaced from the select line 42. The source contacts 34 connect the source regions 24 of the field-effect transistor 12 in parallel with the select line 42, and the drain contacts 36 connect the drain regions 26 in parallel with the metal island 44. The select line 42 is isolated from the metal island 44 by a portion of the dielectric layer 40. The select line 42 may be shared with additional bitcells substantially identical to the bitcell 10 that are arranged in a row of the memory array.

The M1 level and V0 level of the interconnect structure 30 are formed in a dielectric layer 46 arranged over the M0 level. The M1 level includes metal islands 48 that are connected by vias 49 in the V0 level with the metal island 44. The metal islands 48 are aligned transverse to the select line 42 in the M0 level and extend laterally to a different region of the bitcell 10. The M1 level also includes a word line 50 arranged parallel to the metal islands 48. The word line 50 is isolated from the metal islands 48 by portions of the dielectric layer 46. The select line 42 is aligned transverse to the word line 50. In an alternative embodiment, the select line 42 may be aligned parallel, or substantially parallel, to the word line 50. The different arrangements for the select line 42 are enabled by their placement in different metallization levels.

The CA level also includes gate contacts 35 that are physically and electrically connected with the gate electrodes 16 at a location outside of the bitcell 10. The gate electrodes 16 are connected by the gate contacts 35 with a metal island 45 in the M0 level, and the metal island 45 is connected by a via 51 in the V0 level with the word line 50. As a result, the gate electrodes 16 are connected by the gate contacts 35 in parallel with the word line 50 in the M1 level. The gate electrodes 16 are shared among a column of bitcells substantially identical to, and including, the bitcell 10. The gate contacts 35, metal island 45, and via 51 provide a shared connection between the shared gate electrodes 16 and the word line 50. The shared connection between the gate electrodes 16 and the word line 50 may be made in a dummy column 70 of the memory device array. The dummy column 70 may, for example, lack source and drain regions, as well as a memory element, in contrast with the construction of the bitcell 10. By utilizing the gate contact 35 in the dummy column 70, the gate electrodes 16 are not connected with the word line 50 at a location over the bitcell 10 or over other bitcells in the memory device array that share the gate electrodes 16, but the word line 50 is instead strapped to the gate electrodes 16 external to the bitcell 10.

The M2 level and the V1 level of the interconnect structure 30 are formed in a dielectric layer 52 arranged over the M1 level. The M2 level includes a metal island 54 that is connected by a via 53 in the V1 level with the metal islands 48 in the M1 level.

The M3 level and the V2 level of the interconnect structure 30 are formed in a dielectric layer 56 arranged over the M2 level. The M3 level includes a metal island 58 that is connected by a via 57 in the V2 level with the metal island 54 in the M2 level. The arrangement of the via 57 and metal island 58 assists in determining the placement of the memory element 32 within the bitcell 10 and, in particular, assists with providing a central placement of the memory element 32 within the bitcell 10.

The M4 level and the V3 level of the interconnect structure 30 are formed in a dielectric layer 60 arranged over the M2 level. The M4 level may include the memory element 32 that is connected with the metal island 58 and a bit line (BL) 62 that is connected from above with the memory element 32. In alternative embodiments, the M4 level may include a metal island that is connected by a via in the V3 level with the metal island 58, and the memory element 32 may be formed in a higher metallization level of the interconnect structure 30. The memory element 32 is connected from below with the drain regions 26 by a node supplied by the metal islands 44, 48, 54, 58, vias 49, 53, 57, and drain contacts 36.

The bitcell 10 may have an outer boundary 68 that is nominally established by the source regions 24 and the drain regions 26. The field-effect transistor 12 is arranged inside the boundary 68. The memory element 32 may be arranged proximate to a center of the area in a plane (e.g., the x-y plane) that is bounded by the outer boundary 68 due at least in part to the 4CPP layout of the gate electrodes 16 providing the gate of the field-effect transistor 12 of the bitcell 10. In an embodiment, the memory element 32 may be arranged in the plane at, and symmetrically centered about, the geometrical center of the bitcell 10. The source contacts 34 and the drain contacts 36 are arranged in the interconnect structure 30 inside the outer boundary 68 of the bitcell 10, and the gate contacts 35 are arranged in the interconnect structure 30 outside of the outer boundary 68 of the bitcell 10. The word line 50 may be arranged to cross the bitcell 10 through the center of the area bounded by the outer boundary 68 and, in an embodiment, may be arranged directly beneath the memory element 32 over a portion of the length of the word line 50.

Figure 2:
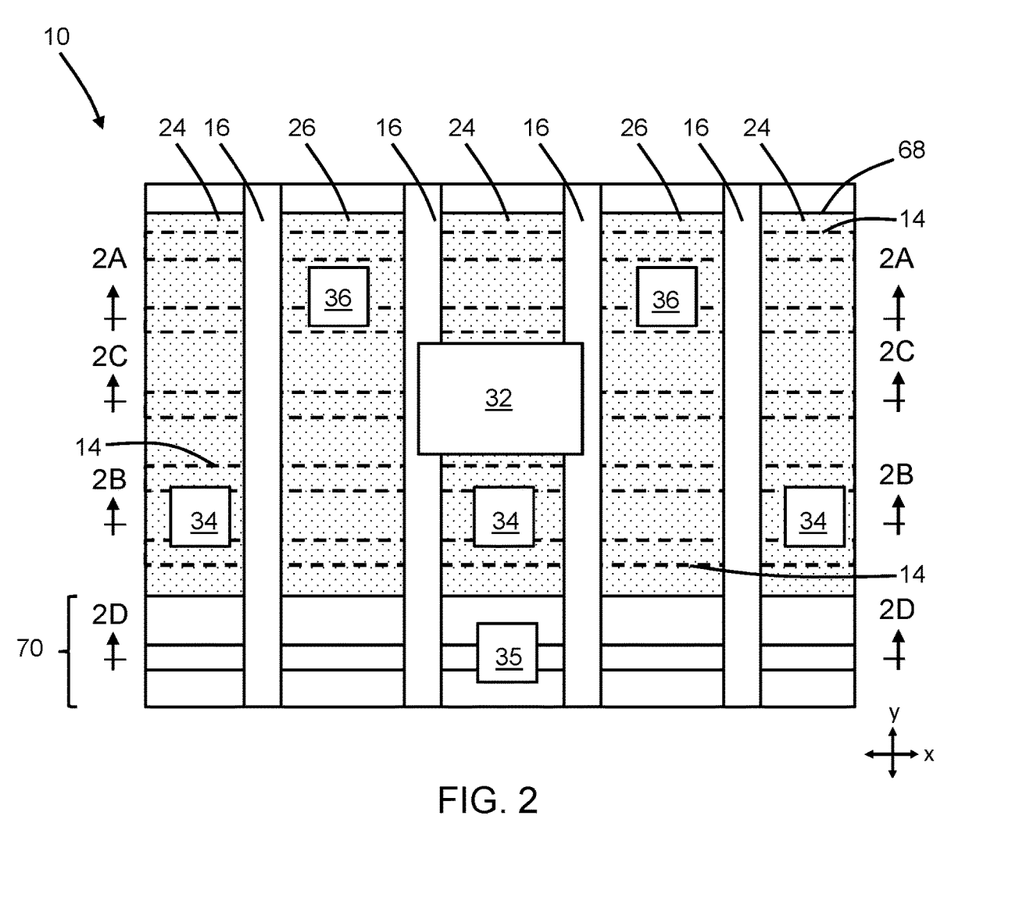
FIG. 2 is a top view of the structure of FIG. 1 following subsequent fabrication stages of the processing method and that has been simplified to illustrate the placement of the source contacts, drain contacts, and memory element.
Figure 2A:
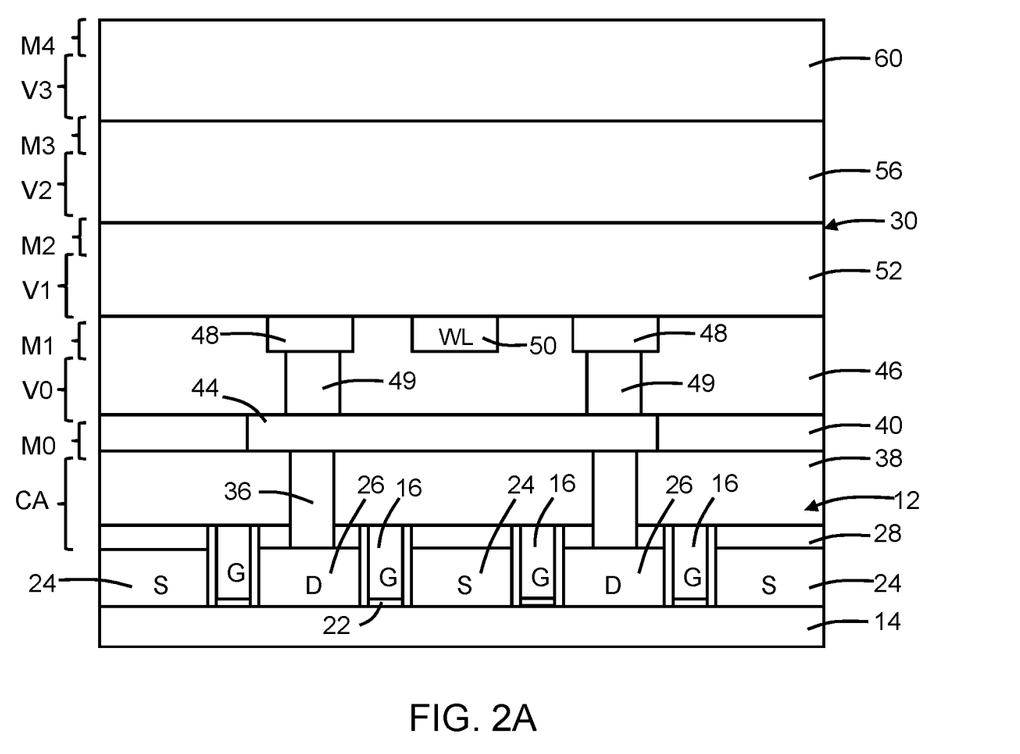
FIG. 2A is a cross-sectional view taken generally along line 2A-2A in FIG. 2.
Figure 2B:
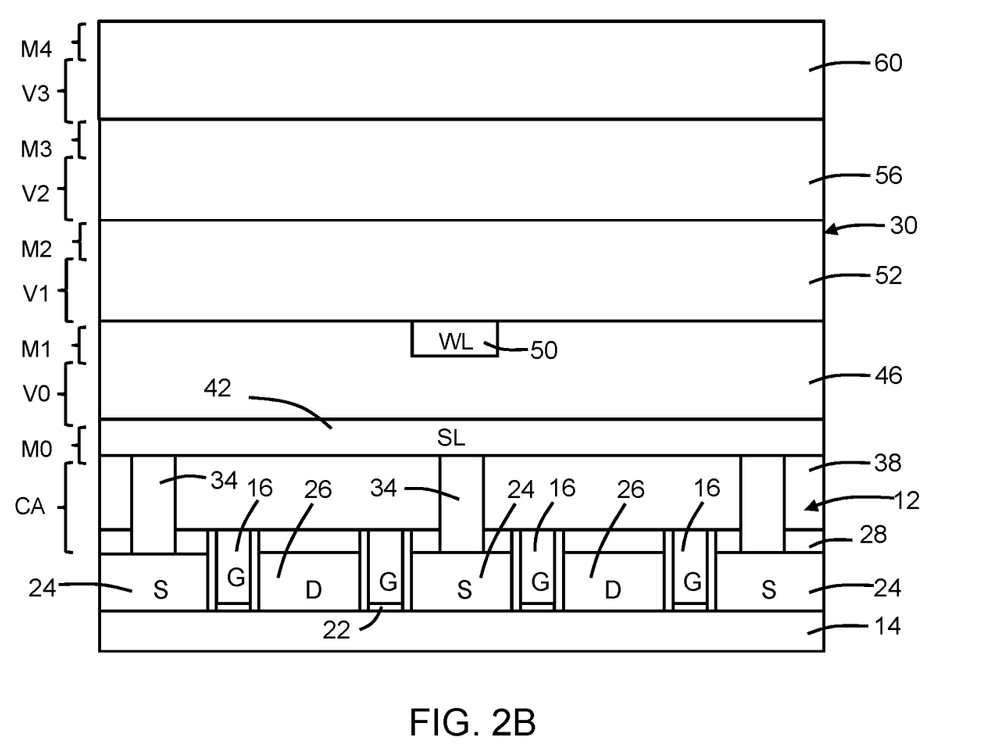
FIG. 2B is a cross-sectional view taken generally along line 2B-2B in FIG. 2.
Figure 2C:
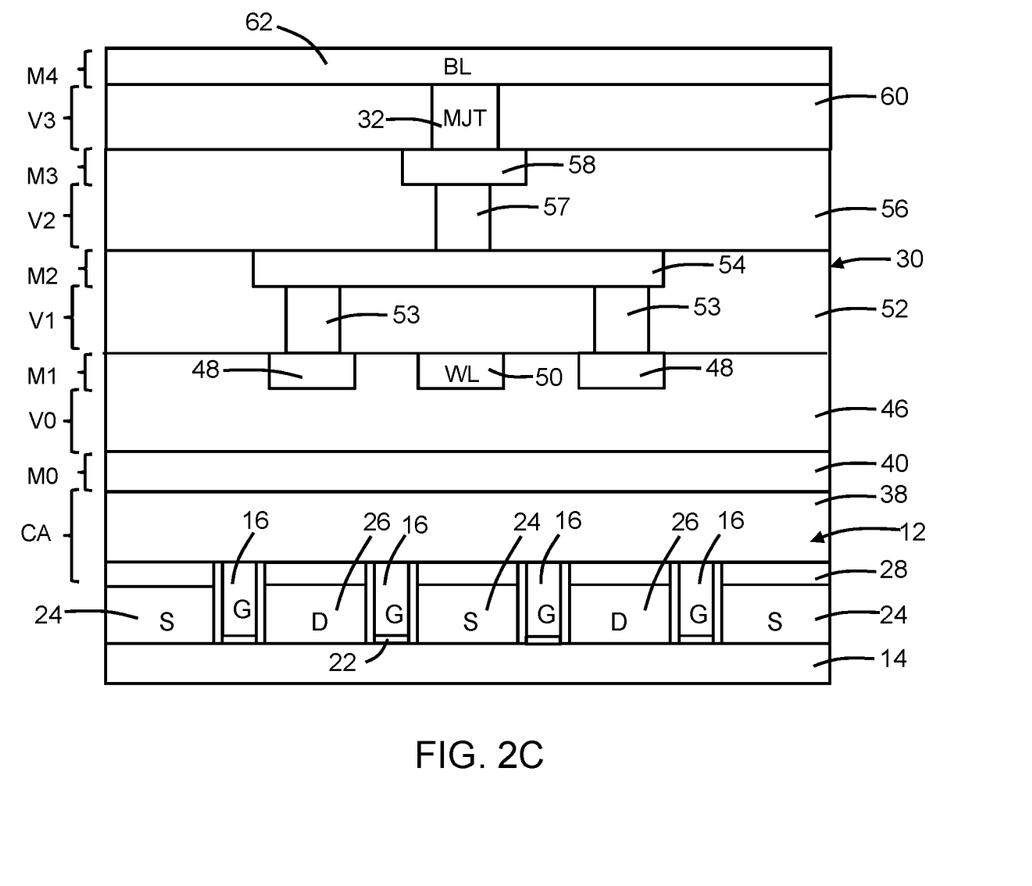
FIG. 2C is a cross-sectional view taken generally along line 2C-2C in FIG. 2.
Figure 2D:
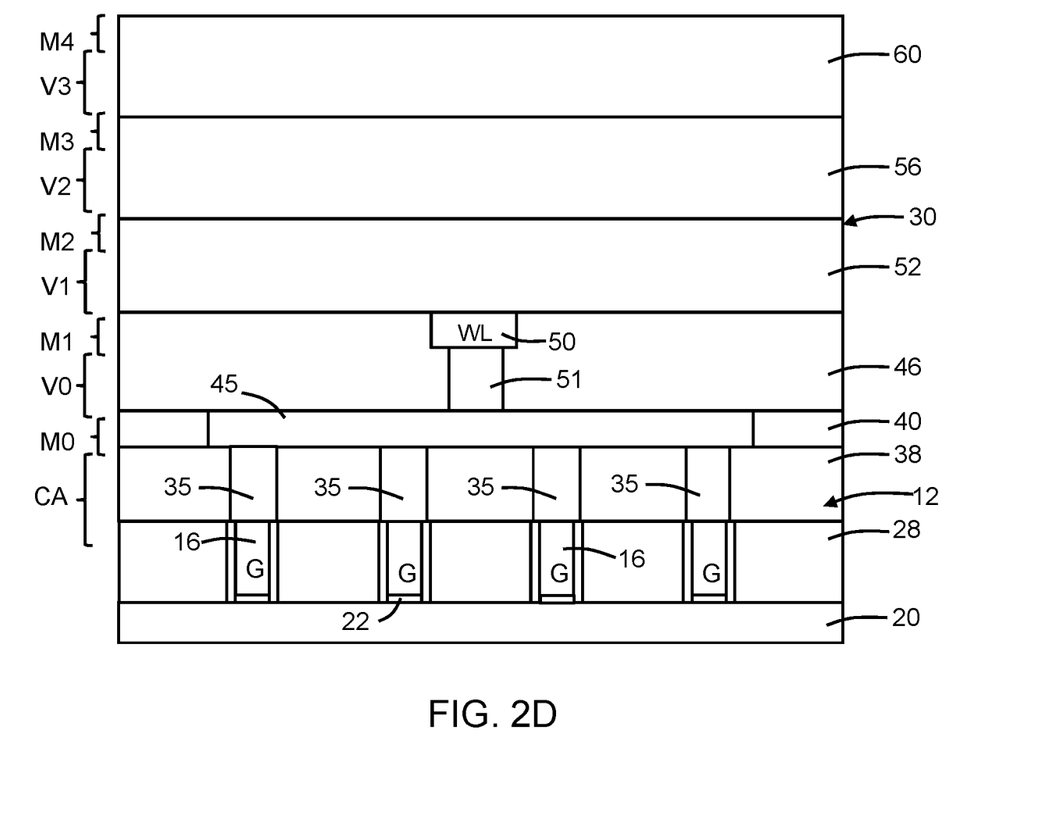
FIG. 2D is a cross-sectional view taken generally along line 2D-2D in FIG. 2.

In an embodiment, the memory element 32 may be a magnetoresistive random access memory (MRAM) element that is non-volatile. Data is stored in the MRAM element through different states generated by a pinned magnetic layer and a free magnetic layer, each of which holds a magnetization. The magnetization of the pinned layer is fixed in its magnetic orientation, and the magnetization of the free layer can be changed by the application of a programming current. In particular, the programming current can cause the magnetic orientations of the free and pinned layers to be parallel, giving a lower electrical resistance across the layers ("0" state), or the programming current can cause the magnetic orientations of the free and pinned layers to either be antiparallel, giving a higher electrical resistance across the layers ("1" state). The switching of the magnetic orientation of the free layer and the resulting high or low resistance states across the free and pinned layers provide for the write and read operations of the MRAM memory element.

In an alternative embodiment, the memory element 32 may be a resistive random access memory (ReRAM) element that is non-volatile. Data is stored in the resistive memory element by changing the resistance across an internal layer containing a dielectric material to provide different states. The dielectric material, which is normally insulating, can be made to conduct through one or more filaments or conductive paths generated by applying a sufficiently high voltage. The resistive memory element switches between the insulating and conducting phases by creating or destroying the filament(s) to respectively write either a "0" state or a "1" state.

The bitcell 10 includes the field-effect transistor 12 and the memory element 32 that is connected with the field-effect transistor 12. The placement of the memory element 32 at or near the center of the bitcell 10, in conjunction with the 4CPP layout for the gate electrodes 16 of the field-effect transistor 12, may provide for a memory array with distributed pitch in both directions (i.e., the x-direction and the y-direction). The design for the bitcell 10 is independent of the select line (SL) direction (e.g., the select line 42 may be aligned parallel to the gate electrodes 16 or transverse to the gate electrodes 16), which may provide flexibility in the design of a memory array architecture using the layout of the bitcell 10. In comparison with more-rectangular structures, the more-squarish structure of the bitcell 10 provides an aspect ratio of length to width is more friendly and flexible to the formation of the metal stack in the BEOL portion of the interconnect structure 30. In effect, a larger structure for the bitcell 10 may be permitted within the same area as a rectangular structure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bitcell, the structure comprising:
   a field-effect transistor including a gate having a plurality of gate electrodes that are arranged in a four contacted (poly) pitch layout;
   an interconnect structure arranged over the field-effect transistor; and
   a memory element arranged in the interconnect structure, the memory element connected by the interconnect structure with the field-effect transistor,
   wherein the bitcell includes an outer boundary, and the memory element is arranged inside the outer boundary proximate to a center of an area bounded by the outer boundary.

2. The structure of claim 1 wherein the interconnect structure includes a word line, a metal island, and a plurality of gate contacts connected with the metal island, and the plurality of gate electrodes are connected by the plurality of gate contacts and the metal island in parallel with the word line.

3. The structure of claim 2 wherein the plurality of gate contacts are arranged outside of the outer boundary.

4. The structure of claim 3 wherein the word line is arranged to cross the bitcell beneath the memory element.

5. The structure of claim 4 wherein the word line passes through the center of the area bounded by the outer boundary.

6. The structure of claim 1 wherein the field-effect transistor includes a plurality of drain regions, and the memory element is connected by the interconnect structure with the plurality of drain regions of the field-effect transistor.

7. The structure of claim 1 wherein the memory element is a magnetoresistive random access memory element.

8. The structure of claim 1 wherein the memory element is a resistive random access memory element.

9. The structure of claim 1 wherein the field-effect transistor includes a plurality of source regions, the interconnect structure includes a word line and a select line, and the interconnect structure includes plurality of contacts that connect the plurality of source regions in parallel with the select line.

10. The structure of claim 9 wherein the select line is arranged transverse to the plurality of gate electrodes.

11. A structure for a bitcell, the structure comprising:
    a field-effect transistor including a gate having a plurality of gate electrodes that are arranged in a four contacted (poly) pitch layout;
    an interconnect structure arranged over the field-effect transistor; and
    a memory element arranged in the interconnect structure, the memory element connected by the interconnect structure with the field-effect transistor,
    wherein the field-effect transistor includes a plurality of source regions, the interconnect structure includes a word line and a select line, and the interconnect structure includes plurality of contacts that connect the plurality of source regions in parallel with the select line.

12. The structure of claim 11 wherein the select line is arranged transverse to the plurality of gate electrodes.

13. The structure of claim 11 wherein the plurality of gate electrodes are connected by the interconnect structure in parallel with the word line.

14. A method of forming a structure for a bitcell, the method comprising:
    forming a field-effect transistor that includes a gate having a plurality of gate electrodes that are arranged in a four contacted (poly) pitch layout;
    forming an interconnect structure arranged over the field-effect transistor; and
    forming a memory element arranged in the interconnect structure,
    wherein the memory element is connected by the interconnect structure with the field-effect transistor, the interconnect structure includes a word line, a metal island, and a plurality of gate contacts connected with the metal island, and the plurality of gate electrodes are connected by the plurality of gate contacts and the metal island in parallel with the word line.

15. The method of claim 14 wherein the bitcell has an outer boundary, and the plurality of gate contacts are arranged outside of the outer boundary.

16. The method of claim 15 wherein the memory element is arranged inside the outer boundary proximate to a center of an area bounded by the outer boundary, and the word line is arranged to cross the bitcell beneath the memory element.

17. The method of claim 14 wherein the field-effect transistor includes a plurality of source regions, the interconnect structure includes a select line, and the interconnect structure includes plurality of contacts that connect the plurality of source regions in parallel with the select line.

18. The method of claim 17 wherein the select line is arranged transverse or perpendicular to the plurality of gate electrodes.

19. The method of claim 14 wherein the memory element is a magnetoresistive random access memory element or a resistive random access memory element.

20. The method of claim 14 wherein the bitcell includes an outer boundary, and the memory element is arranged inside the outer boundary proximate to a center of an area bounded by the outer boundary.

* * * * *